(12) United States Patent
Ozawa

(10) Patent No.: US 8,497,496 B2
(45) Date of Patent: Jul. 30, 2013

(54) DISPLAY DEVICE AND METHOD OF MANUFACTURING THE SAME

(75) Inventor: Nobuo Ozawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 394 days.

(21) Appl. No.: 12/849,533

(22) Filed: Aug. 3, 2010

(65) Prior Publication Data

US 2011/0037071 A1  Feb. 17, 2011

(30) Foreign Application Priority Data

Aug. 11, 2009  (JP) ................. P2009-186732

(51) Int. Cl.
*H01L 51/00*  (2006.01)

(52) U.S. Cl.
USPC ........... 257/40; 257/E51.022; 438/35; 438/99

(58) Field of Classification Search
USPC  257/40, E51.022, E27.121, E33.065; 438/34, 438/35, 99
See application file for complete search history.

(56) References Cited

U.S. PATENT DOCUMENTS

| 2003/0186078 A1* | 10/2003 | Murata et al. ................. 428/690 |
| 2005/0269941 A1* | 12/2005 | Kim et al. ..................... 313/503 |
| 2007/0176859 A1* | 8/2007 | Cok et al. ........................ 345/76 |

FOREIGN PATENT DOCUMENTS

| JP | 2004-207217 | 7/2004 |
| JP | 2005-011810 | 1/2005 |

* cited by examiner

*Primary Examiner* — Julio J. Maldonado
*Assistant Examiner* — Daniel Shook
(74) *Attorney, Agent, or Firm* — K&L Gates LLP

(57) ABSTRACT

A display device includes: a pixel including a plurality of light emitting elements each formed by sequentially stacking a first electrode layer, an organic layer, and a second electrode layer, spaced apart from each other in a first direction orthogonal to the stacking direction thereof, and emitting light emission colors different from each other; and an auxiliary wiring layer electrically connected to the second electrode layer. A plurality of the pixels are aligned in the first direction so as to include a gap which is larger than a gap between the light emitting elements adjacent to each other, and the auxiliary wiring layer is provided between the pixels adjacent to each other.

10 Claims, 19 Drawing Sheets

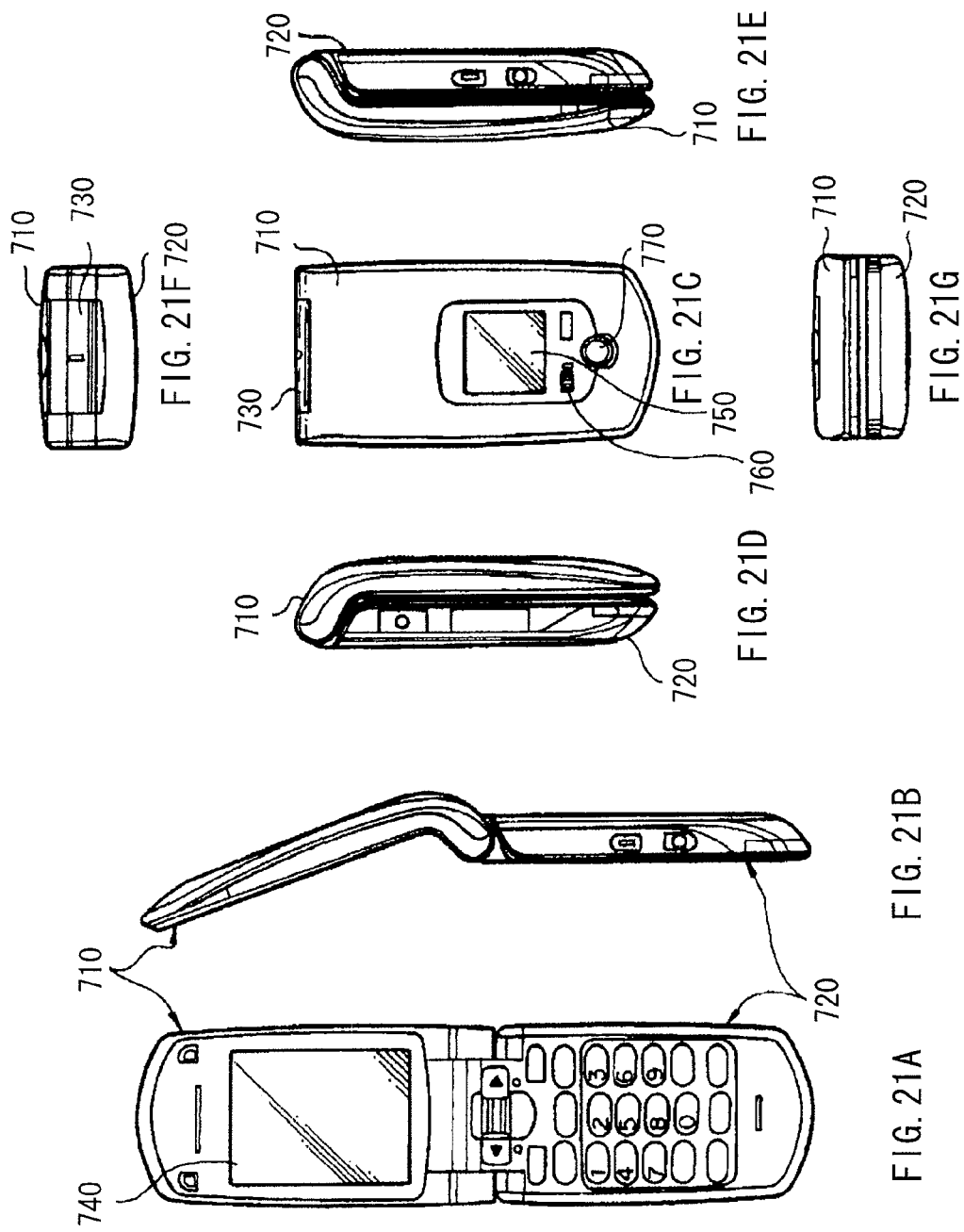

DISPLAY DEVICE AND METHOD OF MANUFACTURING THE SAME

CROSS REFERENCES TO RELATED APPLICATIONS

The present application claims priority to Japanese Patent Application JP 2009-186732 filed on Aug. 11, 2009, the entire contents of which is hereby incorporated by reference.

BACKGROUND

The present disclosure relates to a display device including a self-luminous light emitting element which includes an organic layer, and a method of manufacturing the same.

In recent years, as a display device in substitution for a liquid crystal display, an organic EL display device using a self-luminous organic EL (electro luminescence) element which includes an organic layer has been put into practical use. Since the organic EL display device is self-luminous, the organic EL display device has a wide viewing angle in comparison with liquid crystal or the like. Further, the organic EL display device has sufficient response characteristics to a high-definition and high-speed video signal.

In driving methods of the organic EL display device, an active matrix method in which a thin film transistor (TFT) is used as a drive element is superior in terms of response characteristics and resolution, in comparison with a passive matrix method. Thus, the active matrix method is regarded as an especially-appropriate drive method in the organic EL display device having the above-described features. The organic EL display device employing the active matrix method includes a drive panel in which an organic EL element including an organic light emitting layer, and a drive element (the above-described thin film transistor) for driving the organic EL element are disposed. Further, the drive panel and a sealing panel are bonded to each other by an adhesive layer so as to sandwich the organic EL element in between. The organic EL element has a structure in which the organic light emitting layer is formed between a pair of electrodes.

The organic EL display device is classified into a bottom emission method type in which light from each organic EL element is emitted to the drive panel side, and a top emission method type in which the light is emitted to the sealing panel side in reverse. In the case where the both methods are compared, the top emission method is advantageous in that the aperture ratio may be further improved.

Here, in the organic EL display device employing the top emission method, an electrode on light extraction side, that is, an electrode on the sealing panel side is an electrode used in common to each of the organic EL elements, and is, for example, composed of a light transmissive conductive material such as ITO (indium tin oxide). However, in such a light transmissive conductive material, the resistance is approximately double-digit or triple-digit higher in comparison with a typical metal material. Thus, since a voltage applied to the electrode on the light extraction side becomes non-uniform in the plane, the variation of the light emission luminance depending on the position is generated among each of the organic EL elements, and there is an issue that the display quality is lowered.

As a display device to solve this issue, for example, there is known organic EL display devices disclosed in Japanese Unexamined Patent Publication Nos. 2004-207217, and 2005-11810. In those organic EL display devices, an auxiliary wiring connected to an electrode (upper electrode) on the light extraction side which is on the same layer level as an electrode (lower electrode) on the drive panel side is formed, and a voltage drop is suppressed in the in-plane direction of the lower electrode.

SUMMARY

In Japanese Unexamined Patent Publication No. 2004-207217, after forming the lower electrode and the auxiliary wiring, pixels composed of a red light emitting element, a green light emitting element, and a blue light emitting element are sequentially formed by using individual evaporation masks for coloring organic layers with each light emission color. At this time, the organic layer is not deposited in a part of a region on the auxiliary wiring, and the auxiliary wiring and the upper electrode are connected in that region. However, in such a manufacturing method, it is necessary to evaporate and deposit an organic material for each light emission color, and the pixels are separately formed by using the individual evaporation masks even when the organic material is the same kind. Thus, the manufacture tact is long, and the total amount of the used organic material is drastically increased.

Further, in Japanese Unexamined Patent Publication No. 2005-11810, after forming the lower electrode and the auxiliary wiring, the organic layer is deposited over the whole surface, and the organic layer deposited on the auxiliary wiring is selectively removed through the use of laser irradiation, thereby realizing the connection between the auxiliary wiring the upper electrode. However, in the manufacturing method described above, the step of removing the organic material by laser is added, and the manufacturing process is complicated. Further, there is an issue of the cost increase of equipment such as a laser light source.

In view of the foregoing, it is desirable to provide a display device having a structure which is more simply manufacturable, while ensuring favorable display characteristics, and a method of manufacturing the same.

According to an embodiment, there is provided a display device including: a pixel including a plurality of light emitting elements each formed by sequentially stacking a first electrode layer, an organic layer, and a second electrode layer, spaced apart from each other in a first direction orthogonal to the stacking direction thereof, and emitting light emission colors different from each other; and an auxiliary wiring layer electrically connected to the second electrode layer. Here, a plurality of the pixels are aligned in the first direction so as to include a gap which is larger than a gap between the light emitting elements adjacent to each other, and the auxiliary wiring layer is provided between the pixels adjacent to each other.

In the display device according to the embodiment, the plurality of the pixels are aligned in the first direction so as to include the gap which is larger than the gap between the light emitting elements in each of the pixels, and the auxiliary wiring layer is provided between the pixels adjacent to each other. Thus, it is advantageous to set a width of the auxiliary wiring layer large, while reducing a distance between the light emitting elements emitting the different light emission colors.

According to an embodiment, there is provided a method of manufacturing a display device comprising steps of: forming a plurality of auxiliary wiring layers spaced apart from each other in a first direction on a substrate; and forming a pixel between the auxiliary wiring layers adjacent to each other, respectively, the pixel having a stacked structure of a first electrode layer, an organic layer, and a second electrode layer connected to the auxiliary wiring layer, and including a plurality of light emitting elements emitting light emission colors different from each other. Here, the plurality of light emitting elements are aligned so as to include a gap which is smaller than a gap between the pixels adjacent to each other in the first direction.

In the method of manufacturing a display device according to the embodiment, in the first direction, the auxiliary wiring layer is provided between the pixels adjacent to each other, and the gap between the pixels adjacent to each other is set to be larger than the gap between the light emitting elements in each of the pixels. Thus, it is easy to set a width of the auxiliary wiring layer large, while reducing a distance between the light emitting elements emitting different light emission colors.

According to the display device of the embodiment, in the first direction, the gap between the pixels is set to be larger than the gap between the light emitting elements, and the plurality of auxiliary wiring layers are provided between the pixels adjacent to each other. Thus, it is possible to display an image in which luminance is more homogenized, while realizing high integration without reducing an aperture ratio. Further, even in the case where the display device is highly integrated, for example, by using a common mask covering a region corresponding to the auxiliary wiring layer, and including an aperture corresponding to a region other than the region corresponding to the auxiliary wiring layer, it is possible to form layers used in common to the plurality of light emitting elements in the organic layer. Therefore, the display device is more efficiently manufacturable without deteriorating high-precision dimensions.

According to the method of manufacturing a display device, in the first direction, the gap between the pixels is set to be larger than the gap between the light emitting elements, and the plurality of auxiliary wiring layers are provided between the pixels adjacent to each other. Thus, even in the case where the display device is highly integrated, by using the common mask covering the region corresponding to the auxiliary wiring layer, and including the aperture corresponding to the region other than the region corresponding to the auxiliary wiring layer, it is possible to form layers used in common to the plurality of light emitting elements in the organic layer. Therefore, it is possible to more efficiently manufacture the display device having higher-precision dimensions, and exhibiting favorable display characteristics.

Additional features and advantages are described herein, and will be apparent from the following Detailed Description and the figures.

BRIEF DESCRIPTION OF THE FIGURES

FIGS. 21A to 21G are schematic views illustrating an appearance of a fifth application example.

DETAILED DESCRIPTION

An embodiment will be described in detail with reference to the drawings.

(Overall Structure of Display Device)

Figure 1:
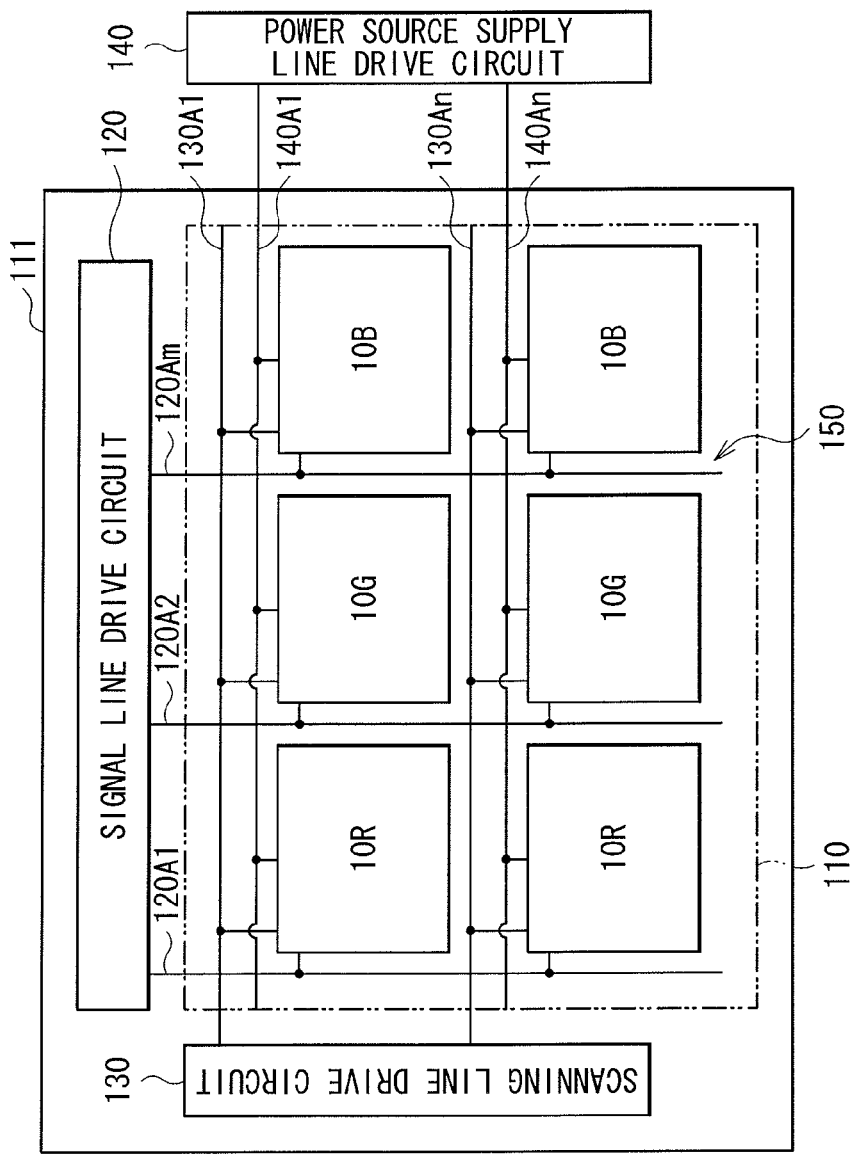
FIG. 1 is a view illustrating the structure of a display device according to an embodiment.

FIG. 1 illustrates the structure of a display device using an organic light emitting element according to an embodiment. This display device is used as an ultra thin organic light emitting color display device or the like. In this display device, a display region 110 is formed on a substrate 111. In the vicinity of the display region 110 on the substrate 111, for example, a signal line drive circuit 120, a scanning line drive circuit 130, and a power source supply line drive circuit 140 as drivers for video display are formed.

In the display region 110, a plurality of organic light emitting elements 10 (10R, 10G, and 10B) two-dimensionally arranged in matrix, and a pixel drive circuit 150 for driving these organic light emitting elements 10 are formed. In the pixel drive circuit 150, a plurality of signal lines 120A (120A1, 120A2, ..., 120Am, ...) are arranged in the column direction, and a plurality of scanning lines 130A (130A1, 130A2, ..., 130An, ...), and a plurality of power source supply lines 140A (140A1, 140A2, ..., 140An, ...) are arranged in the row direction. In each intersection of each signal line 120A and each scanning line 130A, one of the organic light emitting elements 10R, 10G, and 10B is disposed correspondingly. Each signal line 120A is connected to the signal line drive circuit 120, each scanning line 130A is connected to the scanning line drive circuit 130, and each power source supply line 140A is connected to the power source supply line drive circuit 140.

The signal line drive circuit 120 supplies a signal voltage of a video signal corresponding to luminance information which is supplied from a signal supply source (not illustrated in the figure), to the organic light emitting elements 10R, 10G, and 10B selected through the signal line 120A.

The scanning line drive circuit 130 is composed of a shift resistor or the like sequentially shifting (transferring) a start pulse in synchronization with an input clock pulse. At the time of writing the video signal onto each of the organic light emitting elements 10R, 10G, and 10B, the scanning line drive circuit 130 scans those organic light emitting elements 10R, 10G, and 10B line by line, and sequentially supplies the scanning signal to each scanning line 130A.

The power source supply line drive circuit 140 is composed of a shift resistor or the like sequentially shifting (transferring) the start pulse in synchronization with the input clock pulse. In synchronization with line-by-line scanning by the scanning line drive circuit 130, the power source supply line drive circuit 140 appropriately supplies one of a first potential and a second potential which are different from each other to each power source supply line 140A. Thereby, the conductive state or the non-conductive state of a drive transistor Tr1 which will be described later is selected.

Figure 2:
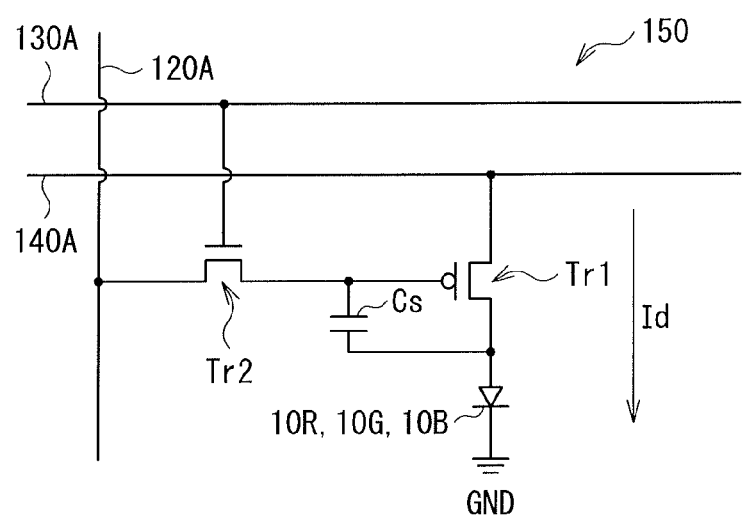
FIG. 2 is a view illustrating an example of a pixel drive circuit illustrated in FIG. 1.

The pixel drive circuit 150 is provided on a layer level (a pixel drive circuit formation layer 112 which will be described later) between the substrate 111 and the organic light emitting element 10. FIG. 2 illustrates a structural example of the pixel drive circuit 150. As illustrated in FIG. 2, the pixel drive circuit 150 is an active drive circuit including the drive transistor Tr1, a write transistor Tr2, a capacitor (retention capacity) Cs between the drive transistor Tr1 and the write transistor Tr2, and the organic light emitting element 10. The organic light emitting element 10 is connected in series to the drive transistor Tr1 between the power source supply line 140A and a common power source supply line (GND). The drive transistor Tr1 and the write transistor Tr2 are composed of a typical thin film transistor (TFT), and the structure of the Tr1 and Tr2 may be, for example, an unstaggered structure (so-called bottom gate type) or a staggered structure (top gate type), and is not specifically limited.

For example, a drain electrode of the write transistor Tr2 is connected to the signal line 120A, and the video signal from the signal line drive circuit 120 is supplied to the drain electrode. A gate electrode of the write transistor Tr2 is connected to the scanning line 130A, and the scanning signal from the scanning line drive circuit 130 is supplied to the gate electrode. Further, a source electrode of the write transistor Tr2 is connected to a gate electrode of the drive transistor Tr1.

For example, a drain electrode of the drive transistor Tr1 is connected to the power source supply line 140A, and the drive transistor Tr1 is set to one of the first electrode and the second electrode by the power source supply line drive circuit 140. A source electrode of the drive transistor Tr1 is connected to the organic light emitting element 10.

The retention capacity Cs is formed between the gate electrode of the drive transistor Tr1 (the source electrode of the write transistor Tr2), and the source electrode of the drive transistor Tr1.

(Structure of Display Region)

Figure 3:
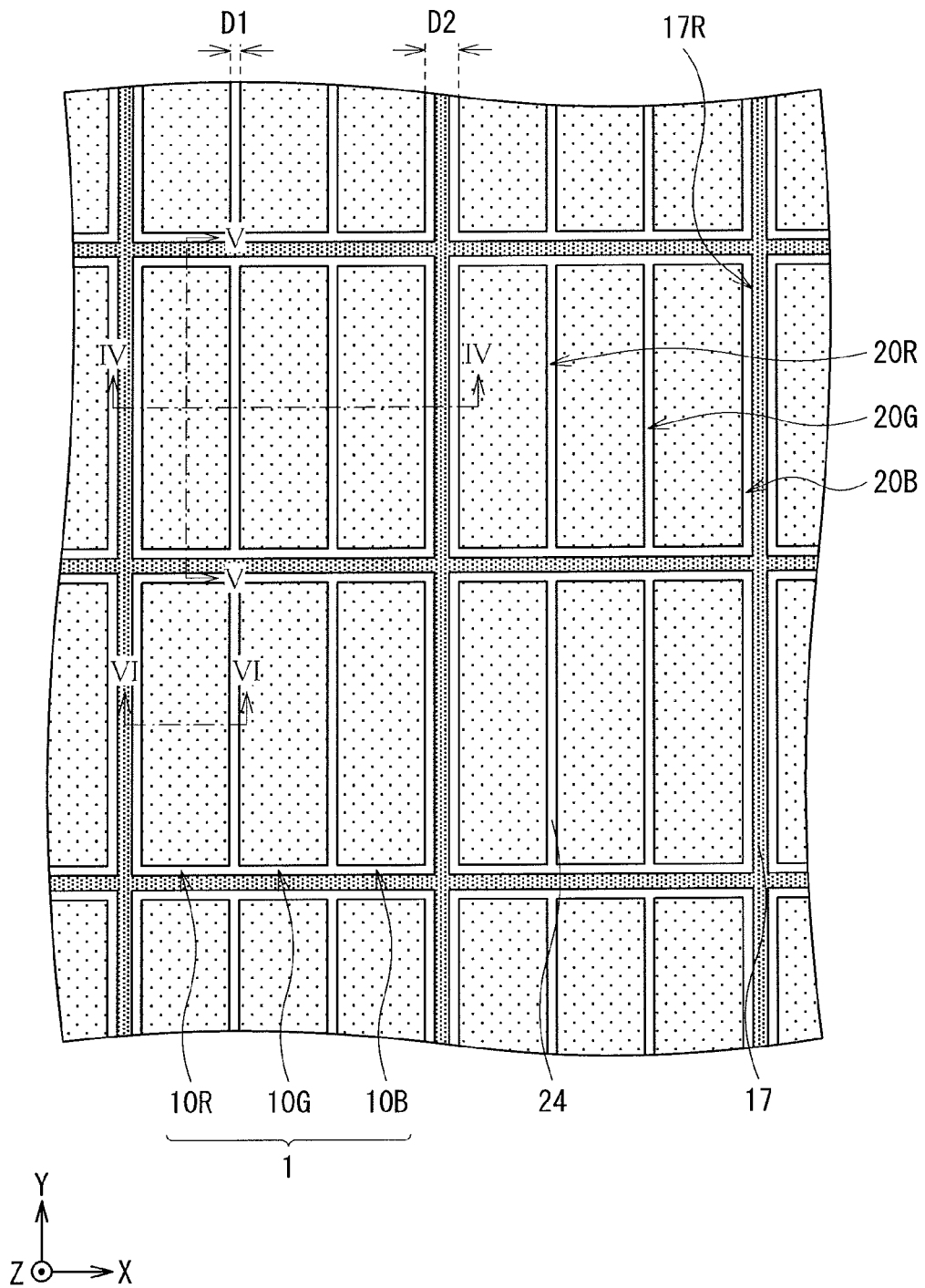
FIG. 3 is a plan view illustrating the structure of a display region illustrated in FIG. 1.

FIG. 3 illustrates a structural example of the display region 110 spread in an XY plane. Here, the plan structure of the display region 110 in the state where a second electrode layer 16, a protective film 18, and a sealing substrate 19 (all will be described later) are removed is illustrated as viewed from the upper side. In the display region 110, a plurality of pixels 1 are sequentially aligned so as to form a matrix as a whole. For more detail, an auxiliary wiring layer 17 is provided in a lattice pattern, and thereby the pixel 1 is provided one by one in each of the pixel regions 17R which are divided by the auxiliary wiring layer 17. Each pixel 1 includes a set of the organic light emitting elements 10R, 10G, and 10B including light emitting regions 20 (20R, 20G, and 20B) whose contours are defined by an element separating layer 24. The organic light emitting element 10R emits red light, the organic light emitting element 10G emits green light, and the organic light emitting element 10B emits blue light. Each of the organic light emitting elements 10R, 10G, and 10B has a rectangular flat shape whose length in the Y direction is in the longitudinal direction. Here, the organic light emitting elements 10 emitting the same color are aligned on a line in the Y direction, and these organic light emitting elements 10 are sequentially repeatedly arranged in the X direction. That is, in each pixel 1, the organic light emitting elements 10R, 10G, and 10B are, for example, aligned in this order in the X direction so as to include a gap D1 in between, respectively. The plurality of pixels 1 are aligned in the X direction so as to leave a gap D2 in between. The gap D2 is larger than the gap D1 which is located between the organic light emitting elements adjacent to each other.

In FIG. 3, the rectangular shaped light emitting regions 20R, 20G, and 20B illustrated with solid lines in each pixel region 17R correspond to the shape of a first electrode layer 13 (which will be described later) which constitutes each of the organic light emitting elements 10R, 10G, and 10B. In FIG. 3, although a total of the four pixels 1 aligned in two rows and two columns are illustrated, the number of the pixels 1 aligned in the X direction and the Y direction is not limited to this.

Figure 4:
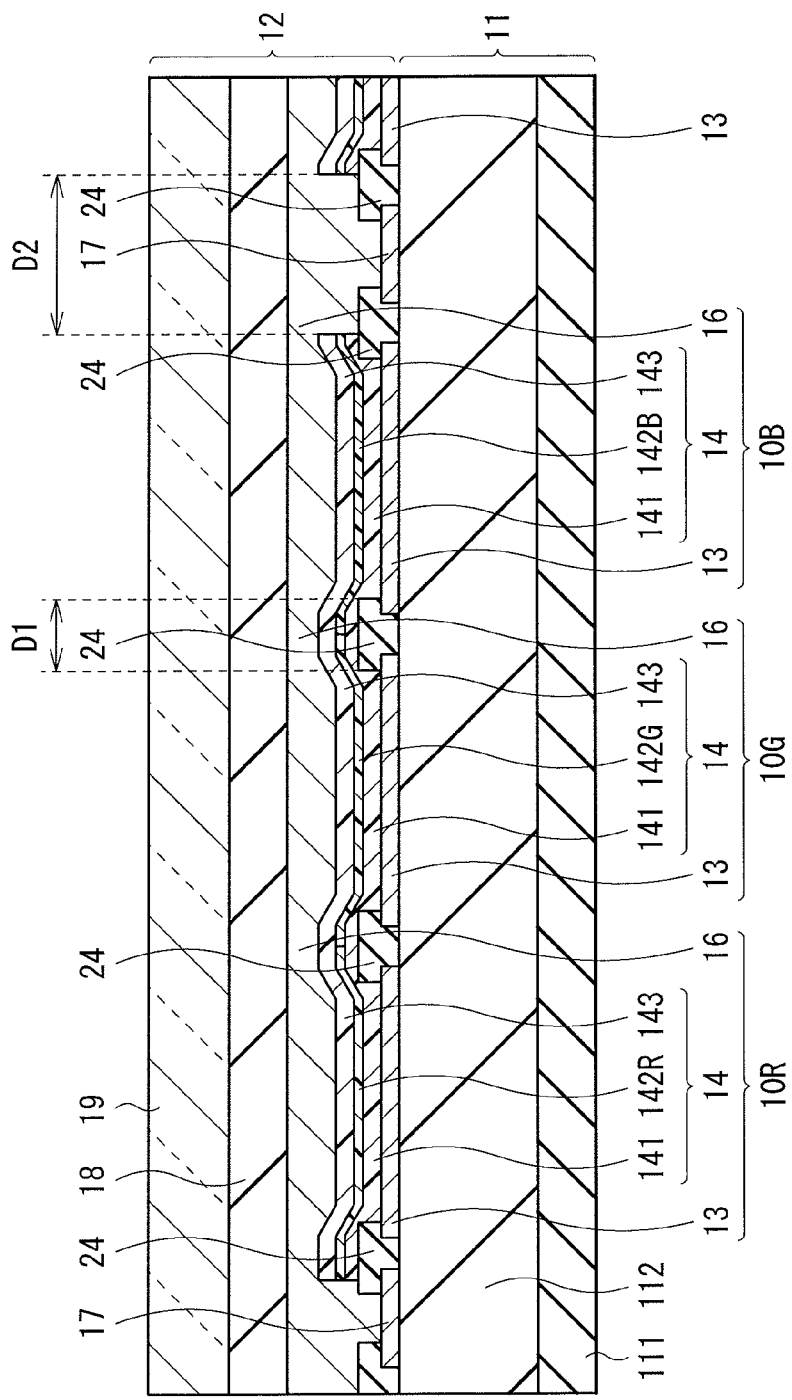
FIG. 4 is a cross-sectional view illustrating the structure of a pixel region illustrated in FIG. 3.

FIG. 4 illustrates the schematic structure of the XZ cross section of the display region 110 along line IV-IV illustrated in FIG. 3. As illustrated in FIG. 4, in the display region 110, a light emitting element formation layer 12 including the organic light emitting elements 10R, 10G, and 10B is formed on a base 11 which is formed by providing the pixel drive circuit formation layer 112 on the substrate 111. On the organic light emitting elements 10R, 10G, and 10B, the protective film 18 and the sealing substrate 19 are sequentially provided. Each of the organic light emitting elements 10R, 10G, and 10B is, for example, formed by sequentially stacking, from the substrate 111 side, the first electrode layer 13 as an anode electrode, an organic layer 14 including a light emitting layer 142 (142R, 142G, and 142B) and the like, and the second electrode layer 16 as a cathode electrode. The organic layer 14 and the first electrode layer 13 are separated for each of the organic light emitting elements 10R, 10G, and 10B by the element separating layer 24. Meanwhile, the second electrode layer 16 is provided in common to all the pixels 1. The auxiliary wiring layer 17 is connected to the second electrode layer 16. In addition, in FIG. 4, the detailed structure of the drive transistor Tr1, the write transistor Tr2, and the like in the pixel drive circuit formation layer 112 is omitted in the illustration.

The element separating layer 24 is provided so as to fill the gap between the first electrode layers 13 and between the organic layers 14 in the organic light emitting elements 10 adjacent to each other. The element separating layer 24 is, for example, composed of an organic material having electrical insulating properties such as polyimide so as to ensure the electrical insulation among the first electrode layer 13, the second electrode layer 16, and the auxiliary wiring layer 17, and is intended to accurately define the light emitting region 20 in the organic light emitting element 10 into a desirable shape.

The protective film 18 covering the organic light emitting element 10 is composed of an insulating material such as silicon nitride (SiNx). The sealing substrate 19 provided on the protective film 18 is intended to seal the organic light emitting element 10 in cooperation with the protective film 18, an adhesive layer (not illustrated in the figure), and the like, and is composed of a material such as transparent glass which transmits light generated in the light emitting layer 142.

(Structure of Substrate and Organic Light Emitting Element)

Next, with reference to FIGS. 4 to 6, the detailed structure of the base 11 and the organic light emitting element 10 will be described. In addition, since the organic light emitting elements 10R, 10G, and 10B have the structures common to each other except that a part of the structure of the organic layer 14 is different from each other, the description will be collectively given, hereinafter.

Figure 5:
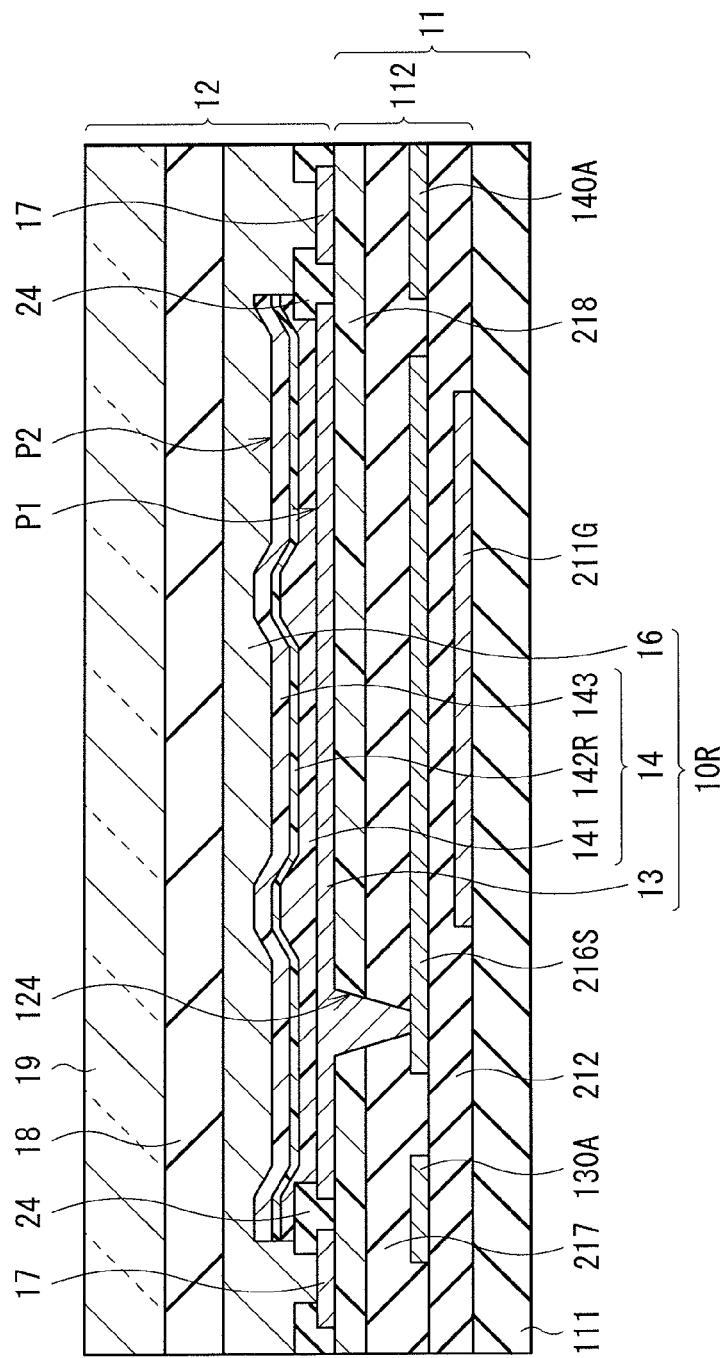
FIG. 5 is a cross-sectional view illustrating the structure of an organic light emitting element illustrated in FIG. 4.
Figure 6:
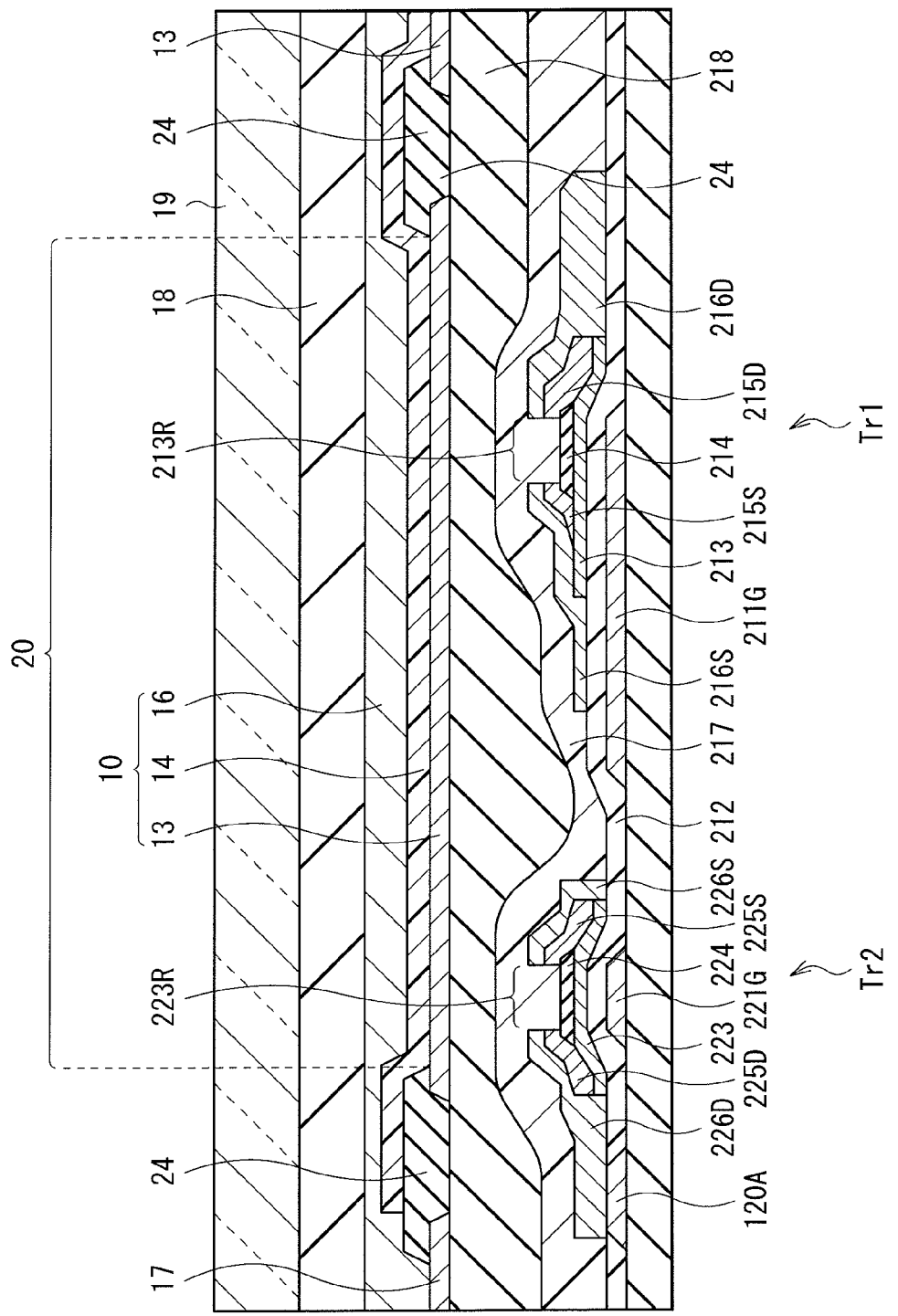
FIG. 6 is another cross-sectional view illustrating the structure of the organic light emitting element illustrated in FIG. 4.

FIG. 5 is a cross-sectional view of the display region 110 along line V-V illustrated in FIG. 3, and FIG. 6 is a cross-sectional view along line VI-VI illustrated in FIG. 3.

In the base 11, the pixel drive circuit formation layer 112 including the pixel drive circuit 150 is provided on the substrate 111 which is made of glass, silicon (Si) wafer, resin or the like. On the surface of the substrate 111, a metal layer 211G serving as the gate electrode of the drive transistor Tr1, a metal layer 221G serving as the gate electrode of the write transistor Tr2, and the signal line 120A (FIG. 6) are provided as metal layers on a first layer level, respectively. The metal layers 211G and 221G, and the signal line 120A are covered with a gate insulating film 212 made of silicon nitride, silicon oxide, or the like. On the gate insulating film 212, in a region corresponding to the metal layers 211G and 221G, channel layers 213 and 223 made of a semiconductor thin film of amorphous silicon or the like are provided. On the channel layers 213 and 223, insulating channel protective films 214 and 224 are provided so as to occupy channel regions 213R and 223R as being middle regions of the channel layers 213 and 223. In regions on both sides of the channel protective films 214 and 224, drain electrodes 215D and 225D, and source electrodes 215S and 225S made of an n-type semiconductor thin film of n-type amorphous silicon or the like are provided. The drain electrodes 215D and 225D, and the source electrodes 215S and 225S are separated from each other by the channel protective films 214 and 224, and end faces thereof are spaced apart from each other with the channel regions 213R and 223R in between. Further, metal layers 216D and 226D serving as drain wirings, and metal layers 216S and 226S serving as source wirings are provided as metal layers on a second layer level so as to cover the drain electrodes 215D and 225D, and the source electrodes 215S and 225S, respectively. Each of the metal layers 216D and 226D, and the metal layers 216S and 226S has, for example, a structure in which a titanium (Ti) layer, an aluminum (Al) layer, and a titanium layer are stacked in this order. In addition to the metal layers 216D and 226D, and the metal layers 216S and 226S, the scanning line 130A, and the power source supply line 140A (FIG. 5) are provided as the metal layers on the second layer level. Here, although the drive transistor Tr1 and the write transistor Tr2 having the unstaggered structure (so-called bottom gate type) has been described, the drive transistor Tr1 and the write transistor Tr2 may have the staggered structure (so-called top gate type). Further, the signal line 120A may be provided in a region on the second layer level, instead of being provided in the intersection of the scanning line 130A and the power source supply line 140A.

The pixel drive circuit 150 is entirely covered with a protective film (passivation film) 217 made of silicon nitride or the like, and a planarizing film 218 having insulating properties is provided on the protective film 217. The surface of the planarizing film 218 desirably has extremely-high flatness. In a part of the region of the planarizing film 218 and the protective film 217, a fine connection hole 124 is provided (refer to FIG. 5). In particular, since the planarizing film 218 has a thickness larger than that of the protective film 217, the planarizing film 218 is preferably composed of a material having favorable pattern accuracy, for example, an organic material such as polyimide.

The first electrode layer 13 formed on the planarizing film 218 also serves as a reflecting film, and is desirably composed of a material having as high reflectance as possible to improve the light emission efficiency. The first electrode layer 13 has, for example, a thickness from 100 nm to 1000 nm both inclusive, and is composed of a simple substance of a metal element such as silver (Au), aluminum (Al), chrome (Cr), titanium (Ti), iron (Fe), cobalt (Co), nickel (Ni), molybdenum (Mo), copper (Cu), tantalum (Ta), tungsten (W), platinum (Pt), neodymium (Nd), or gold (Au), or an alloy of those. The first electrode layer 13 covers the surface of the planarizing film 218, and is formed so as to fill the connection hole 124. Thereby, the first electrode layer 13 is rendered conductive to the drive transistor Tr1 (which will become the metal layer 216S later) through the connection hole 124.

The organic layer 14 is formed without a gap over the whole surface of the light emitting region 20 demarcated by the element separating layer 24. For example, as illustrated in FIGS. 4 to 6, the organic layer 14 has a stacked structure in which a hole transport layer 141, the light emitting layer 142 (142R, 142G, and 142B), and an electron transport layer 143 are stacked in this order from the first electrode layer 13 side. The hole transport layer 141 is intended to improve the hole transport efficiency to the light emitting layer 142. The light emitting layer 142 generates recombination of an electron and a hole by applying an electric field so as to generate light of a color corresponding to the material. The electron transport layer 143 is intended to improve the electron transport efficiency to the light emitting layer 142.

The organic layer 14 includes the light emitting layer 142 which is different depending on the light emission colors of the organic light emitting elements 10R, 10G, and 10B. On the other hand, the hole transport layer 141, and the electron transport layer 143 are used in common to the organic light emitting elements 10R, 10G, and 10B, and are regarded as integrated common layers.

In the organic layer 14, layers other than the hole transport layer 141, the light emitting layer 142, and the electron transport layer 143 may be provided, if necessary. For example, between the first electrode layer 13 and the hole transport layer 141, for example, a hole injection layer made of 4,4', 4"-tris (3-methyl phenyl phenyl amino) triphenyl amine (m-MTDATA), 4,4',4"-tris (2-naphthyl phenyl amino) triphenyl amine (2-TNATA), or the like may be provided. The hole injection layer also serves as a buffer layer for improving the hole injection efficiency and preventing leakage. Further, between the electron transport layer 143 and the second electrode layer 16, an electron injection layer (not illustrated in the figure) made of LiF, $Li_2O$, or the like may be provided. In the case where the hole injection layer and the electron injection layer are provided, it is desirable to form the hole injection layer and the electron injection layer as common layers shared by the organic light emitting elements 10R, 10G, and 10B.

In the organic light emitting elements 10R, 10G, and 10B, the hole transport layer 141 is, for example, composed of bis [(N-naphthyl)-N-phenyl]benzidine (α-NPD), and preferably has, for example, a thickness from 5 nm to 300 nm both inclusive. The electron transport layer 143 has, for example, a thickness from 5 nm to 300 nm both inclusive, and is preferably composed of $Alq_3$.

The (red) light emitting layer 142R of the organic light emitting element 10R is, for example, composed by mixing 40 volume % of 2,6-bis [4-[N-(4-methoxyphenyl)-N-phenyl] aminostyryl]naphthalene-1,5-dicarbonitrile (BSN-BCN) into $Alq_3$. The (green) light emitting layer 142G of the organic light emitting element 10G is, for example, composed by mixing 3 volume % of Coumarin 6 into $Alq_3$. The (blue) light emitting layer 142B of the organic light emitting element 10B is, for example, composed of spiro 6φ. All of the light emitting layers 142R, 142G, and 142B have a thicknesses from 10 nm to 100 nm both inclusive.

The second electrode layer 16 has, for example, a thickness from 5 nm to 50 nm both inclusive, and is composed of a simple substance of a metal element of aluminum (Al), magnesium (Mg), calcium (Ca), sodium (Na), or the like, or an alloy of those. Among them, an alloy of magnesium and silver (MgAg alloy), or an alloy of aluminum (Al) and lithium (Li) (AlLi alloy) is preferable. The second electrode layer 16 is, for example, provided in common to all of the organic light emitting elements 10R, 10G, and 10B, and is arranged so as to face the first electrode layer 13 of each of the organic light emitting elements 10R, 10G, and 10B. Further, the second electrode layer 16 is formed so as to cover not only the organic layer 14, but also the element separating layer 24 and the auxiliary wiring layer 17. Therefore, as described above, the second electrode layer 16 is electrically connected to the auxiliary wiring layer 17.

The auxiliary wiring layer 17 is formed on the surface of the planarizing film 218, in the same manner as the first electrode layer 13, and functions as a main electrode compensating a voltage drop generated in the second electrode layer 16. As a material constituting the auxiliary wiring layer 17, for example, a highly-conductive metal material which is the same type as the material of the first electrode layer 13 is preferable.

In the case where the auxiliary wiring layer 17 is not existed, due to a voltage drop generated in accordance with a distance from a power source (not illustrated in the figure) to each of the organic light emitting elements 10R, 10G, and 10B, the potential of the second electrode layer 16 connected to the common power source supply line GND (refer to FIG. 2) is not uniform among each of the organic light emitting elements 10R, 10G, and 10B, and a significant variation is likely to be generated. Such a potential variation of the second electrode layer 16 causes luminance unevenness in the display region 110, and thus it is not preferable. The auxiliary wiring layer 17 functions to suppress generation of such luminance unevenness while minimizing the voltage drop from the power source to the second electrode layer 16, even in the case where the display device has a large screen.

In the organic light emitting element 10, the first electrode layer 13 exhibits the function as a reflecting layer, meanwhile the second electrode layer 16 exhibits the function as a semi-transmissive reflecting layer. The light generated in the light emitting layer 142 included in the organic layer 14 is multiply-reflected by the first electrode layer 13 and the second electrode layer 16. That is, when an end face on the organic layer 14 side of the first electrode layer 13 is regarded as a first end portion P1, an end face on the organic layer 14 side of the second electrode layer 16 is regarded as a second end portion P2, and the organic layer 14 is regarded as a resonator, the organic light emitting element 10 has a resonator structure in which the light generated in the light emitting layer 142 is resonated and extracted from the second end portion P2 side. By having such a resonator structure, the light generated in the light emitting layer 142 is multiply-reflected, and operates as a kind of narrow band filter. Thereby, the half value width of the spectrum of the extracted light is reduced, and it is possible to improve the color purity. Further, it is possible to attenuate external light incident from the sealing substrate 19 side by the multiple reflection, and it is possible to extremely reduce the reflectance of the external light in the organic light emitting element 10 by using a combination of a phase difference plate and a polarizing plate (not illustrated in the figure).

(Method of Manufacturing Display Device)

Figure 7:
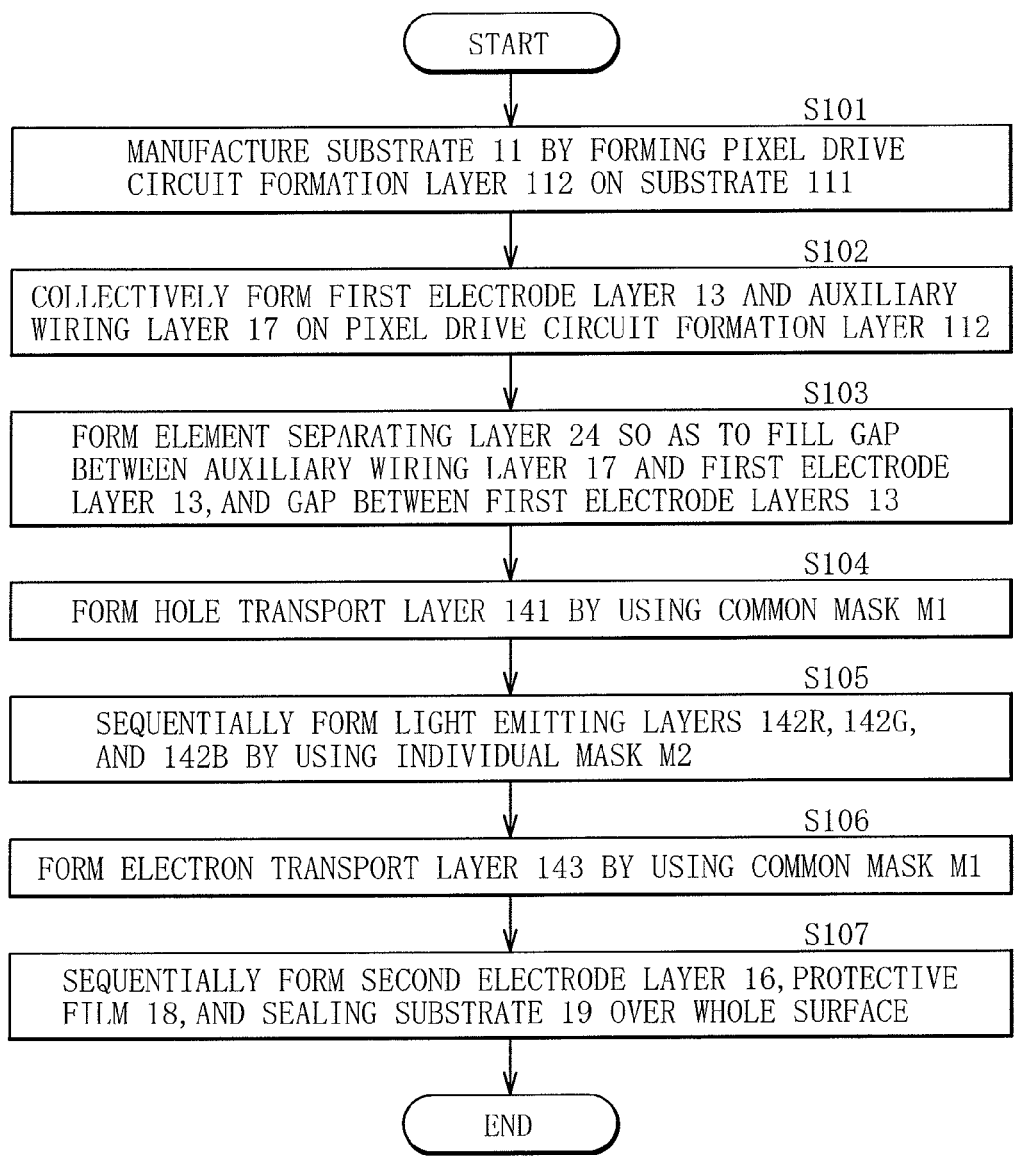
FIG. 7 is a flow chart illustrating procedures for explaining a manufacturing method of the display device illustrated in FIG. 1.

The display device may be manufactured, for example, in the following way. Hereinafter, in addition to FIGS. 1 to 6, FIGS. 7 to 14 are referred for describing a method of manufacturing the display device of this embodiment. FIG. 7 is a flow chart illustrating procedures in the method of manufacturing the display device of this embodiment.

First, by forming the pixel drive circuit formation layer 112 on the substrate 111 made of the above-described material, the base 11 is manufactured (step S101). Specifically, first, the pixel drive circuit 150 including the drive transistor Tr1 and the write transistor Tr2 is formed on the substrate 111. Here, a metal film is formed on the substrate 111, for example, through the use of sputtering. After that, the metal film is patterned, for example, through the use of photolithography method, dry etching, or wet etching, and thereby the metal layers 211G and 221G, and the signal line 120A are formed on the substrate 111. Next, the whole surface is covered with the gate insulating film 212. Further, on the gate insulating film 212, the channel layers 213 and 223, the channel protective films 214 and 224, the drain electrodes 215D and 225D, the source electrodes 215S and 225S, the metal layers 216D and 226D, and the metal layers 216S and 226S are formed into predetermined shapes in this order. Here, in addition to formation of the metal layers 216D and 226D, and the metal layers 216S and 226S, the scanning line 130A and the power source supply line 140A are formed as the metal layers on the second layer level, respectively. At that time, a connection section connecting the metal layer 221G and the scanning line 130A, a connection section connecting the metal layer 226D and the signal line 120A, and a connection section connecting the metal layer 226S and the metal layer 211G are formed in advance. After that, by covering the whole with the protective film 217, the pixel drive circuit 150 is completed. At this time, an aperture is formed in a predetermined position on the metal layer 216S in the protective film 217 through the use of dry etching or the like.

After forming the pixel drive circuit 150, for example, a photosensitive resin containing polyimide as a major component is applied over the whole surface through the use of spin coat method or the like. Next, photolithography treatment is provided onto the photosensitive resin, and thereby the planarizing film 218 including the connection hole 124 is formed. Specifically, the connection hole 124 communicated with the aperture provided in the protective film 217 is, for example, formed through the use of selective exposure and development by using a mask having an aperture in a predetermined position. After that, the planarizing film 218 may be burned, if necessary. Thereby, the pixel drive circuit formation layer 112 is obtained, and the manufacture of the base 11 is completed.

Further, the first electrode layer 13 and the auxiliary wiring layer 17 made of the predetermined materials described above are collectively formed (step S102). Specifically, the metal film made of the above-described material is deposited over the whole surface, for example, through the use of sputtering, and then a resist pattern (not illustrated in the figure) having a predetermined shape is formed on the metal film by using a predetermined mask. Further, by using the resist pattern as a mask, etching is selectively provided onto the metal film. At that time, the fist electrode layer 13 is formed so as to cover the surface of the planarizing film 218 and to fill the connection hole 124. On the surface of the planarizing film 218, the auxiliary wiring layer 17 is formed into a lattice pattern so as to surround the first electrode layers 13 by three. The auxiliary wiring layer 17 is desirably formed of the same type of material as the first electrode layer 13. At this time, the gap between the first electrode layers 13 which will constitute the one pixel 1 later is set to be larger than the gap between the pixels 1 adjacent to each other in the X direction.

After this, the element separating layer 24 is formed so as to fill the gap between the auxiliary wiring layer 17 and the first electrode layer 13, and the gap between the first electrode layers 13 (step S103). At this time, in each pixel region 17R (FIG. 3) divided by the auxiliary wiring layer 17, the gap D1 between the light emitting regions 20 defined by the aperture of the element separating layer 24 is set to be smaller than the gap D2 between the other pixels 1 which are adjacent to each other in the X direction.

Figure 8:
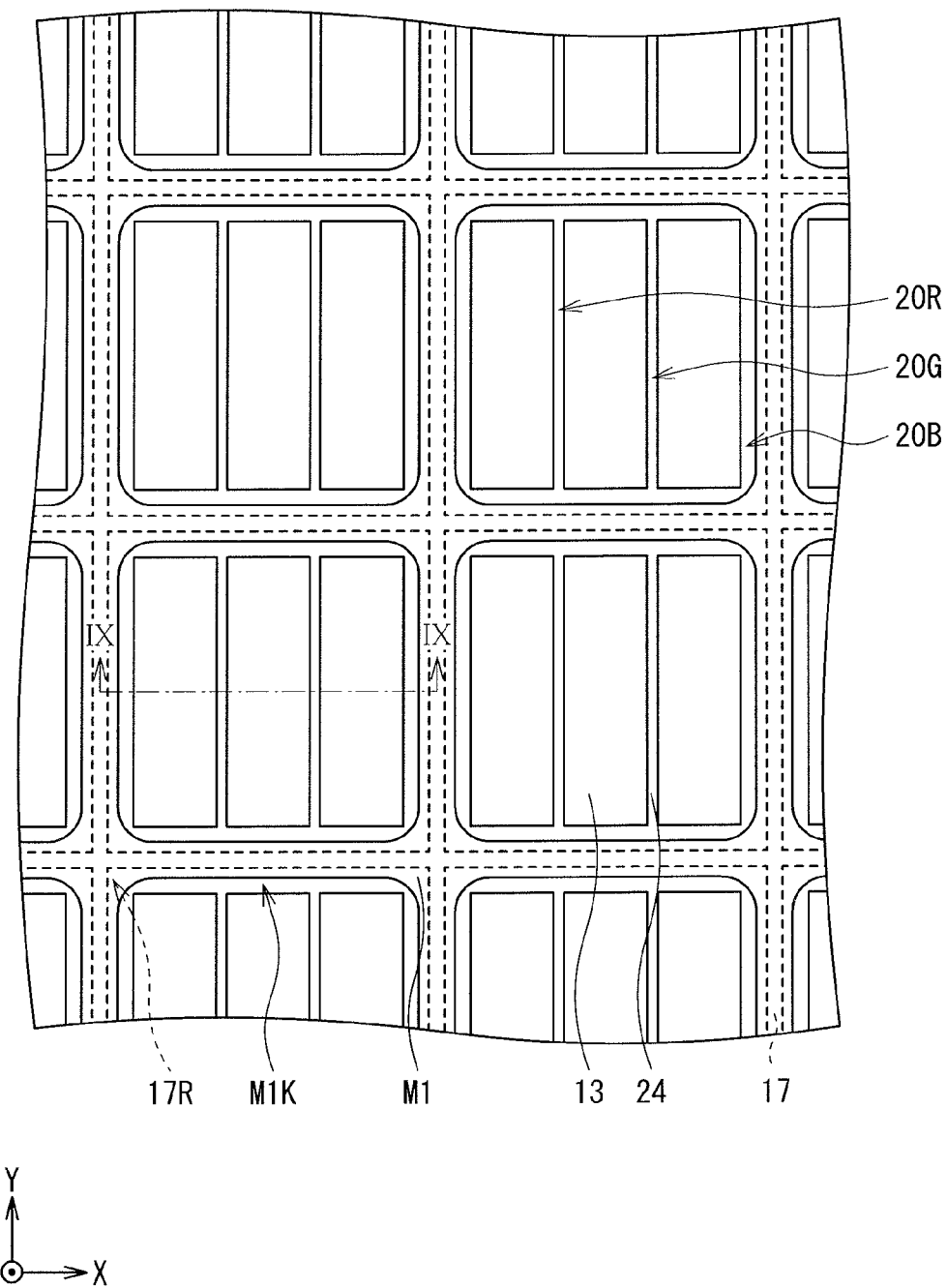
FIG. 8 is a plan view illustrating a step for explaining the manufacturing method of the display device illustrated in FIG. 1.
Figure 9:
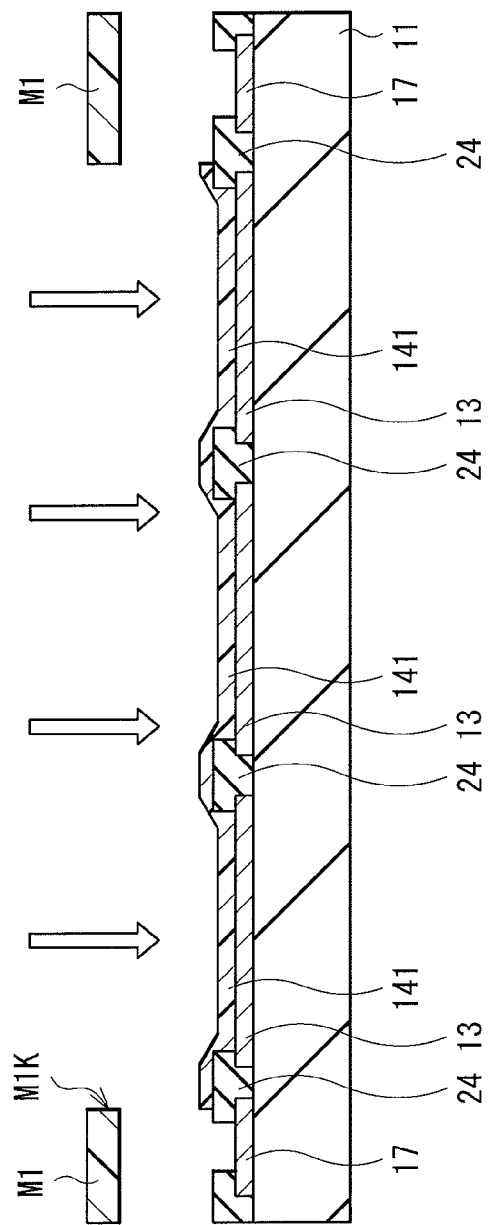
FIG. 9 is a cross-sectional view illustrating a step subsequent to FIG. 8.
Figure 10:
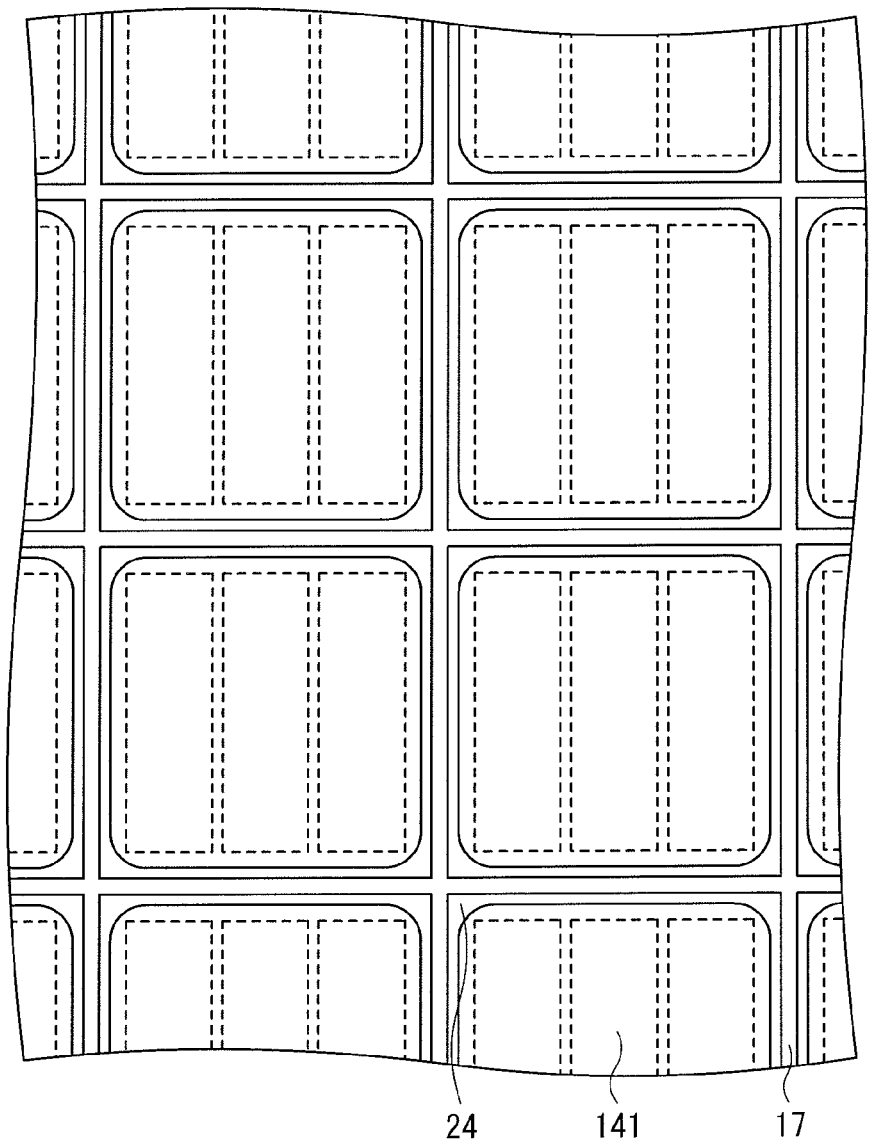
FIG. 10 is a plan view illustrating a step subsequent to FIG. 9.

Next, as illustrated in FIGS. 8 to 10, by using a common mask M1, the hole transport layer 141 is formed as one of the common layers in the organic layer 14 (step S104). FIGS. 8 to 10 are a plan view or a cross-structural view illustrating a step in the method of manufacturing the display device of this embodiment. FIGS. 8 and 10 correspond to FIG. 3, and FIG. 9 corresponds to FIG. 4. In addition, in FIG. 9, the detail of the base 11 is omitted in the illustration. Here, first, as illustrated in FIG. 8, the common mask M1 including a plurality of apertures M1K corresponding to (having shapes and dimensions corresponding to that of) each pixel region 17R in which the pixel 1 is formed is arranged in a predetermined position. After that, as illustrated in FIG. 9, the hole transport layer 141 made of the predetermined material and having the predetermined thickness as described above is formed so as to completely cover the exposed portion through the use of, for example, vacuum evaporation method. Finally, by removing the common mask M1, as illustrated in FIG. 10, the hole transport layer 141 commonly covering three of the first electrode layers 13 which will later become the organic light emitting elements 10R, 10G, and 10B appears in each pixel region 17R. In this embodiment, in comparison with the structure of the existing technique (structure in which the auxiliary wiring layer individually surrounds the organic light emitting element), the gap D2 between the pixels 1 is set to be large. Thus, the common mask M1 has a sufficient intensity, and deflection is not generated. Therefore, the alignment accuracy may be extremely improved.

Figure 11:
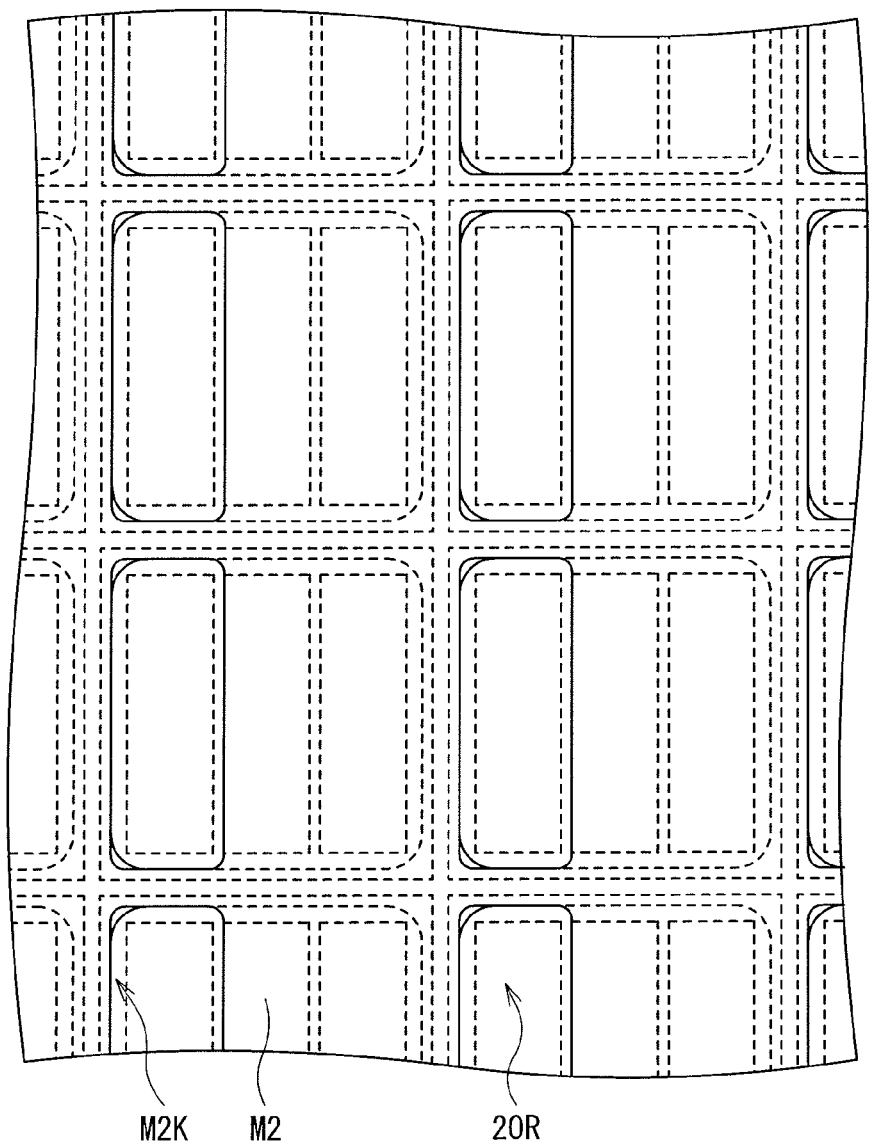
FIG. 11 is a plan view illustrating a step subsequent to FIG. 10.
Figure 12:
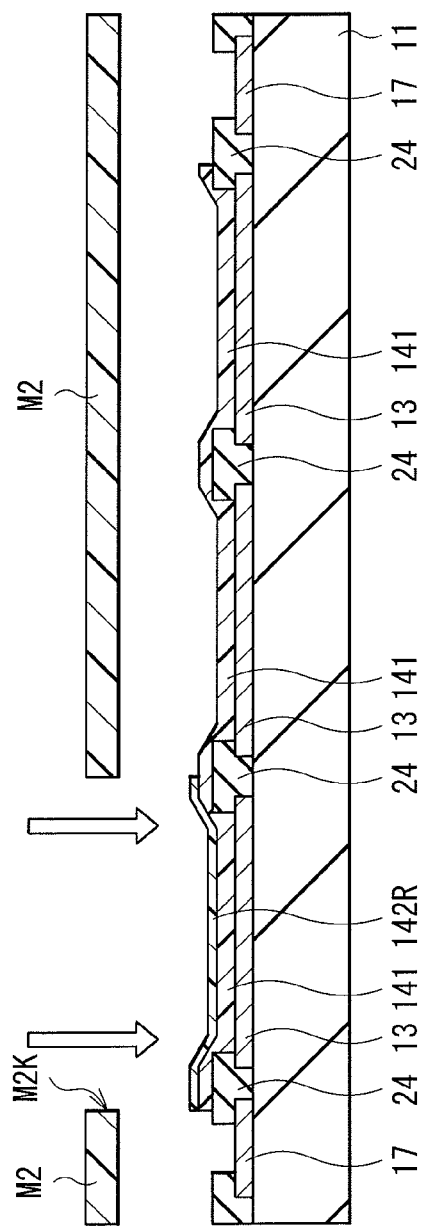
FIG. 12 is a cross-sectional view illustrating a step subsequent to FIG. 11.
Figure 13:
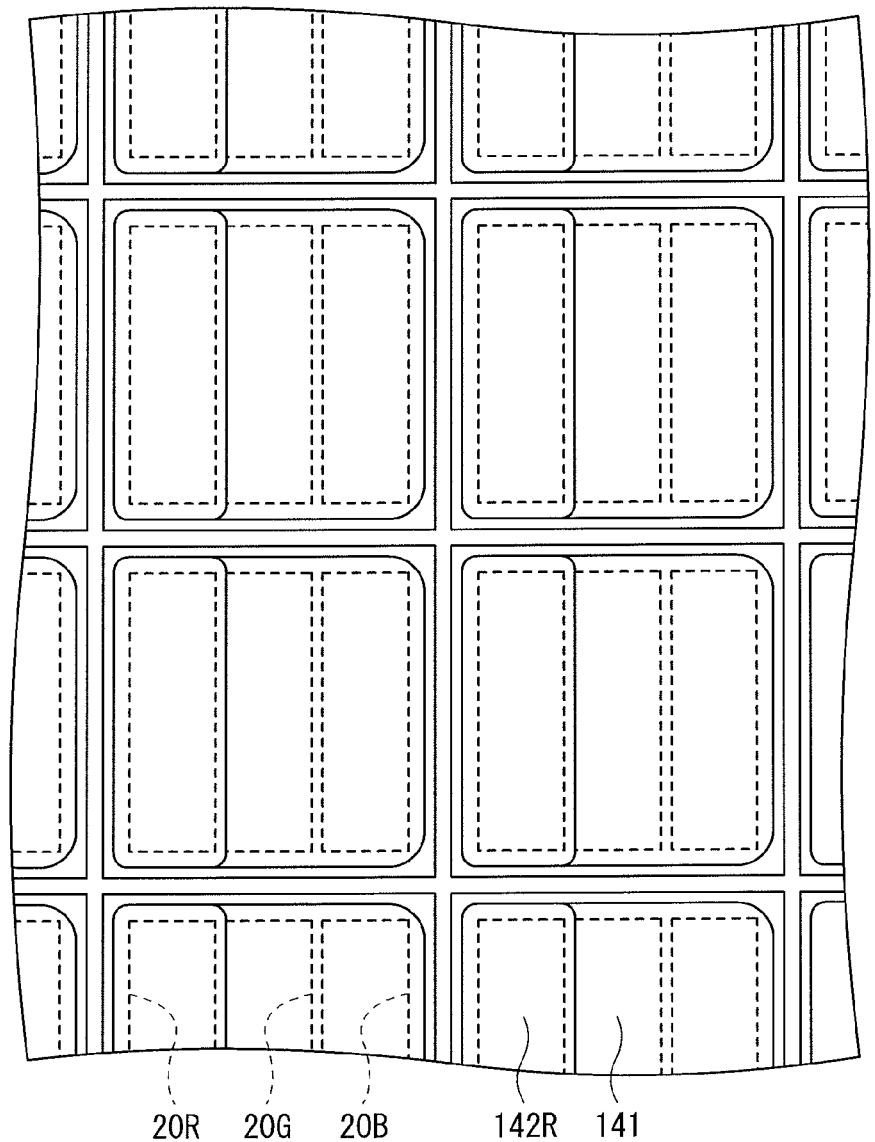
FIG. 13 is a plan view illustrating a step subsequent to FIG. 12.

After forming the hole transport layer 141, the light emitting layers 142R, 142G, and 142B are sequentially formed by using an individual mask M2 (step S105). First, as illustrated in FIG. 11, the individual mask M2 including a plurality of apertures M2K which have shapes and dimensions corresponding to those of the first electrode layers 13 is arranged in a predetermined position. Here, the individual mask M2 is, for example, arranged so as to align the aperture M2K to the position corresponding to the light emitting region 20R in the organic light emitting element 10R which will be formed later. After that, as illustrated in FIG. 12, the light emitting layer 142R made of the predetermined material and having the predetermined thickness as described above is formed so as to completely cover the exposed portion, for example, through the use of vacuum evaporation method. Finally, by removing the individual mask M2, as illustrated in FIG. 13, the light emitting layer 142R covering a part of the hole transport layer 141 appears in the light emitting region 20R. The light emitting layers 142G and 142B are sequentially formed in the same manner. At that time, the individual mask M2 is arranged so that the aperture M2K is arranged in a position corresponding to those of the light emitting regions 20G and 20B, respectively. In addition, FIGS. 11 to 13 are a plan view or a cross-sectional view illustrating a step subsequent to FIGS. 8 to 10. FIGS. 11 and 13 correspond to FIG. 3, and FIG. 12 corresponds to FIG. 4. In FIG. 12, the detail of the base 11 is omitted in the illustration.

Figure 14:
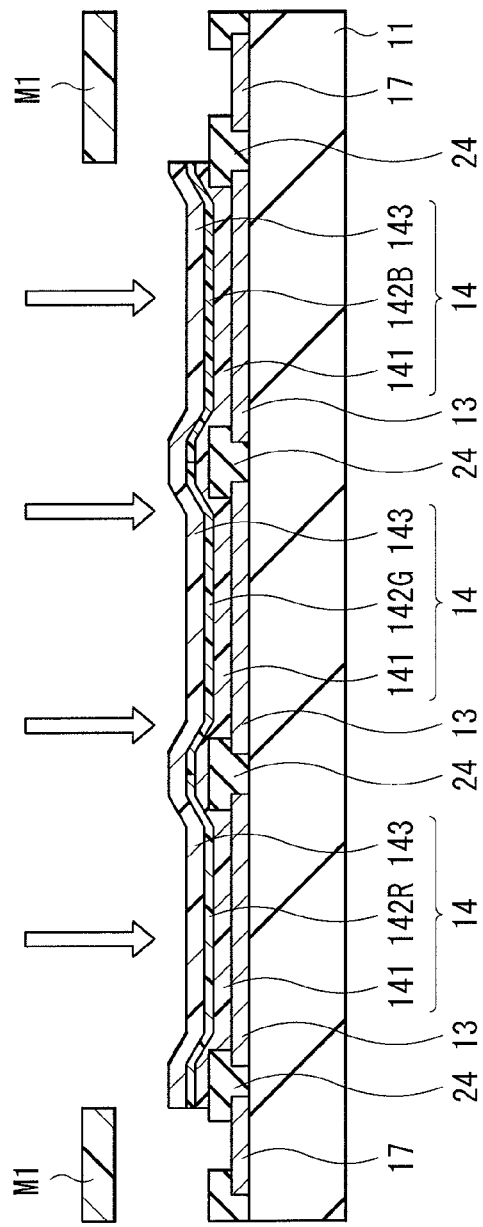
FIG. 14 is a cross-sectional view illustrating a step subsequent to FIG. 13.

Next, by using the common mask M1 again, the electron transport layer 143 is formed on the light emitting layers 142R, 142G, and 142B (step S106). Here, as illustrated in FIG. 14, the electron transport layer 143 is formed as a common layer covering all of the light emitting layers 142R, 142G, and 142B. Thereby, the organic layer 14 is completed.

Further, after removing the common mask M1, the second electrode layer 16 is formed so as to cover the whole by using the predetermined material, and thereby the organic light emitting elements 10R, 10G, and 10B are completed. Finally, the protective film 18 is formed so as to cover the whole, and the sealing substrate is bonded onto the protective film 18 through the adhesive layer. Thereby, the display device is completed (step S107).

(Action of Display Device)

In the display device obtained in this manner, the scanning signal is supplied from the scanning line drive circuit 130 to each pixel through the gate electrode (the metal layer 221G) of the write transistor Tr2, and the video signal from the signal line drive circuit 120 is retained in the retention capacity Cs through the write transistor Tr2. Meanwhile, in synchronization with line-by-line scanning by the scanning line drive circuit 130, the power source supply line dive circuit 140 supplies the first potential which is higher than the second potential to each power source supply line 140A. Thereby, the conductive state of the drive transistor Tr1 is selected, and a drive current Id is injected into each of the organic light emitting elements 10R, 10G, and 10B. Thus, the light emission is generated by recombination of the electron and the hole. This light is multiply-reflected between the first electrode layer 13 and the second electrode layer 16, and transmits the second electrode layer 16, the protective film 18, and the sealing substrate 19 to be extracted from the top face.

As described above, in the display device of this embodiment, the plurality of pixels 1 are aligned in the X direction so as to include the gap D2 which is larger than the gap D1 between the organic light emitting elements 10 in each pixel 1, and the auxiliary wiring layer 17 is provided between the pixels 1 adjacent to each other. Thus, in the case where the aperture ratio is set to be fixed, it is possible to set the width of the auxiliary wiring layer 17 large, while reducing the distance in the X direction between the organic light emitting elements 10 which emit different light emission colors. Therefore, it is possible to display an image in which the luminance is more homogenized in the display region 110, while realizing high integration without reducing the aperture ratio. In addition, in the present invention, although the gap D2 has a value larger than that of the gap D1, this does not become a direct factor of deterioration of the display characteristics. By homogenizing the alignment pitch of the pixels 1, and the alignment pitch of each of the organic light emitting elements 10, it is possible to obtain an image having superior homogeneity.

Further, according to the method of manufacturing the display device of this embodiment, by using the high-intensity common mask M1 covering the region corresponding to the auxiliary wiring layer 17, and including the aperture M1K corresponding to the pixel region 17R, it is possible to collectively form the hole transport layer 141 and the electron transport layer 143 which are used in common to the organic light emitting elements 10R, 10G, and 10B, respectively. Thus, even in the case where the display device is highly integrated, it is possible to efficiently manufacture the display device having high-accuracy dimensions, and exhibiting favorable display characteristics.

2. Modification

Next, with reference to FIG. 15, a modification of the foregoing embodiment will be described. Same reference numerals as in the foregoing embodiment are used to indicate substantially identical components, and thereby the description is appropriately omitted.

Figure 15:
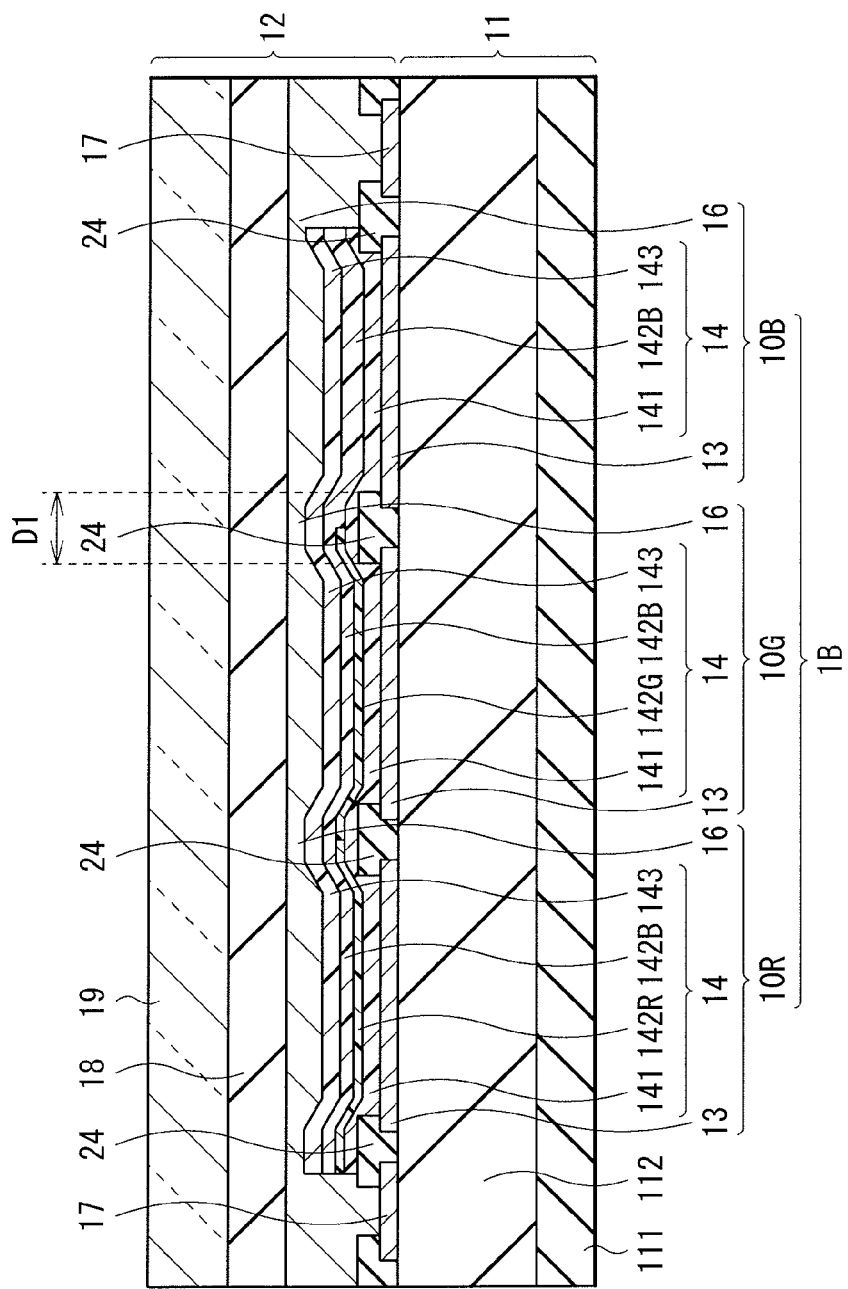
FIG. 15 is a cross-sectional view illustrating a modification of the organic light emitting element illustrated in FIG. 4.

FIG. 15 illustrates the cross-sectional structure of a pixel 1B included in the display device of this modification, and corresponds to FIG. 4. Although the hole transport layer 141 and the electron transport layer 143 are collectively formed as the common layers used in common to the organic light emitting elements 10R, 10G, and 10B in the foregoing embodiment, the (blue) light emitting layer 142B is also used as the common layer in this modification.

When such a pixel 1B is formed, first, the hole transport layer 141, the (red) light emitting layer 142R, and the (green) light emitting layer 142G are sequentially formed in the same manner as the foregoing embodiment. After that, by using the common mask M1, the organic layer 14 is manufactured by sequentially forming the (blue) light emitting layer 142B and the electron transport layer 143 which entirely cover the hole transport layer 141, the (red) light emitting layer 142R, and the (green) light emitting layer 142G.

According to this modification, the production efficiency is improved by further simplifying the manufacture process, and it is possible to reduce the total amount of the organic material necessary for manufacturing the organic layer 14.

An example of the present invention will be described.

By using the method of manufacturing the display device of the foregoing embodiment, the display device in which the diagonal dimension of the display region (screen) was 26 inches (660 mm), and the pixel number (resolution) was 1920×1080 dots was manufactured. In this case, the pixel pitch in the X direction was approximately 300 μm on an average.

In this example, as the common mask M1 and the individual mask M2, masks having a dimension accuracy of ±15 μm were used. Here, the term "dimension accuracy" is a concept including all of the processing accuracy when the common mask M1 and the individual mask M2 are manufactured, the position accuracy of the apertures M1K and M2K, and the alignment accuracy when the organic layer 14 is deposited. Further, the width in the X direction of the auxiliary wiring layer 17 was set to be 6 μm. The dimension of each of the manufactured organic light emitting elements 10 was set to be 58 mm×234 mm. The dimension of the aperture M2K of the individual mask M2 was set to be 88 μm×264 μm from reference to the dimension of each of the organic light emitting elements 10 and the dimension accuracy of the individual mask M2. Further, the dimension of the aperture M1K of the common mask M1 was set to be 264 μm×264 μm from reference to the dimension of each of the organic light emitting elements 10 and the dimension accuracy of the common mask M1. In the common mask M1, the gap between the apertures M1K was 36 μm, and thus it was possible to ensure sufficient intensity.

As a result of the above, it was possible to set the gap D1 between the organic light emitting elements 10 to be 30 μm, and to set the gap D2 between the pixels 1 to be 66 μm. Further, the aperture ratio was 45%, and it was confirmed that the sufficient aperture size was able to be ensured, even in the case where the common mask M1 was used.

3. Module and Application Examples

A description will be made on application examples of the display device described in the foregoing embodiment. The display device of the foregoing embodiment is applicable to display devices in electronic appliances in various fields, in which a video signal input from outside, or a video signal generated inside the display device is displayed as an image or a video, such as a television device, a digital camera, a notebook personal computer, a mobile terminal device such as a mobile phone, and a video camera.

Module

Figure 16:
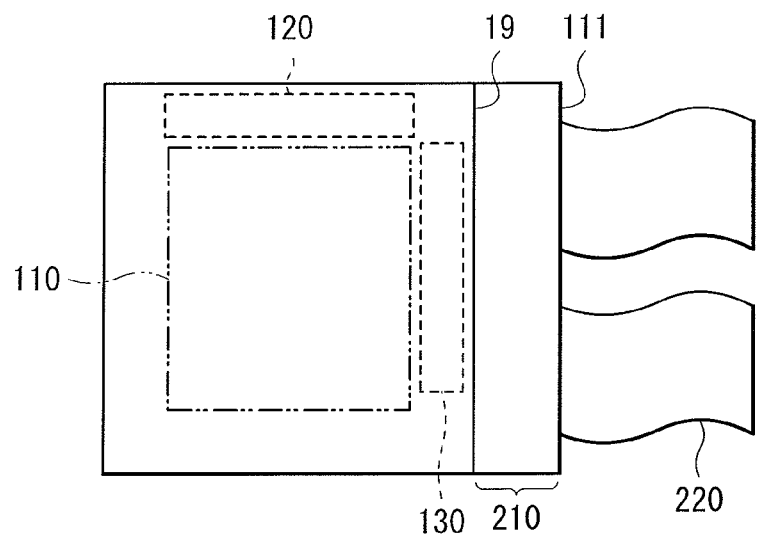
FIG. 16 is a plan view illustrating the schematic structure of a module including the display device of the embodiment.

The display device of the foregoing embodiment is, for example, installed as a module as illustrated in FIG. 16 in various electronic appliances such as first to fifth application examples which will be described later or the like. In the module, for example, a region 210 exposed from the sealing substrate 19 is provided in one side of the substrate 111, and an external connection terminal (not illustrated in the figure) is formed in the exposed region 210 by extending wirings of a signal line drive circuit 120 and a scanning line drive circuit 130. The external connection terminal may be provided with a flexible printed circuit (FPC) 220 for inputting and outputting a signal.

First Application Example

Figure 17:
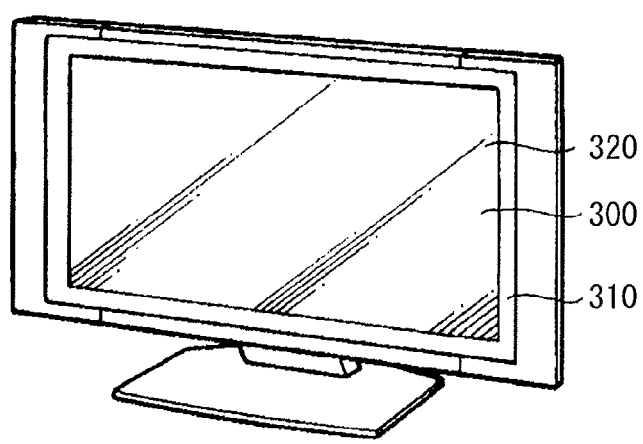
FIG. 17 is a perspective view illustrating an appearance of a first application example of the display device of the embodiment.

FIG. 17 illustrates an appearance of a television device to which the display device of the foregoing embodiment is applied. The television device includes, for example, a video display screen section 300 including a front panel 310 and a filter glass 320. The video display screen section 300 is composed of the display device according to the foregoing embodiment.

Second Application Example

Figure 18A:
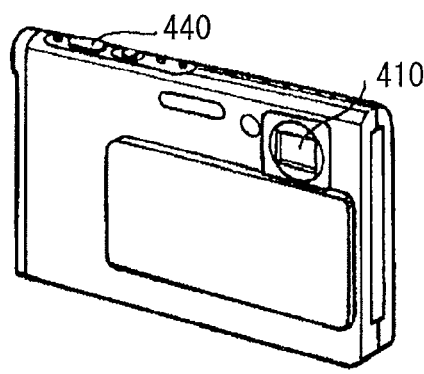
FIGS. 18A and 18B are perspective views illustrating an appearance of a second application example.
Figure 18B:
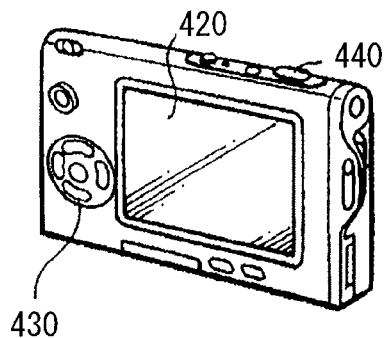

FIG. 18A and FIG. 18B illustrate an appearance of a digital camera to which the display device of the foregoing embodiment is applied. The digital camera includes, for example, a light emitting section for a flash 410, a display section 420, a menu switch 430, and a shutter button 440. The display section 420 is composed of the display device according to the foregoing embodiment.

Third Application Example

Figure 19:
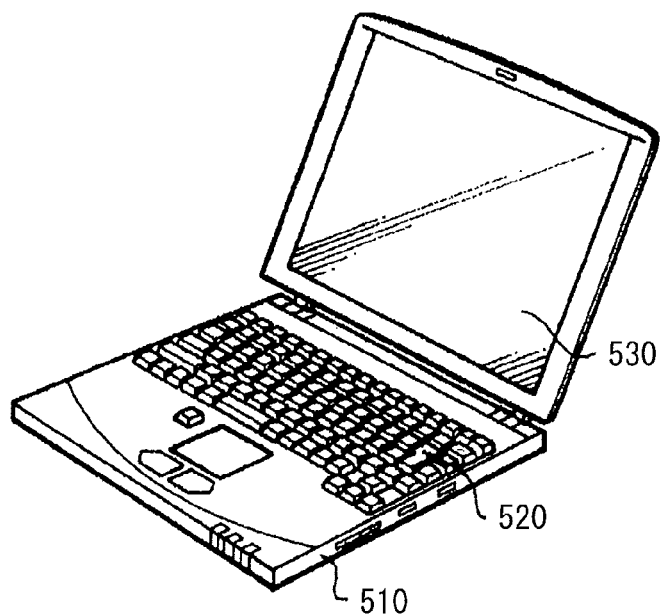
FIG. 19 is a perspective view illustrating an appearance of a third application example.

FIG. 19 illustrates an appearance of a notebook personal computer to which the display device of the foregoing embodiment is applied. The notebook personal computer includes, for example, a main body 510, a keyboard 520 for operation of inputting characters and the like, and a display section 530 for displaying an image. The display section 530 is composed of the display device according to the foregoing embodiment.

Fourth Application Example

Figure 20:
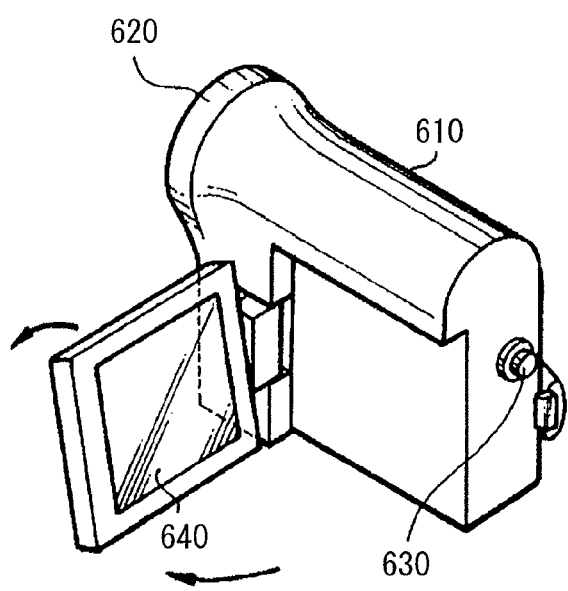
FIG. 20 is a perspective view illustrating an appearance of a fourth application example.

FIG. 20 illustrates an appearance of a video camera to which the display device of the foregoing embodiment is applied. The video camera includes, for example, a main body 610, a lens for capturing an object 620 provided on the front side face of the main body 610, a start/stop switch in capturing 630, and a display section 640. The display section 640 is composed of the display device according to the foregoing embodiment.

Fifth Application Example

FIGS. 21A to 21G illustrate an appearance of a mobile phone to which the display device of the foregoing embodiment is applied. In the mobile phone, for example, an upper package 710 and a lower package 720 are jointed by a joint section (hinge section) 730. The mobile phone includes a display 740, a sub-display 750, a picture light 760, and a camera 770. The display 740 or the sub-display 750 is composed of the display device according to the foregoing embodiment.

The material, the thickness, the film-forming method, the film-forming conditions and the like of each layer are not limited to those described in the foregoing embodiment, but other material, other thickness, other film-forming method, and other film-forming conditions may be adopted. For example, the first electrode layer 13 may be composed of ITO or IZO (indium-zinc composite oxide). Further, the first electrode layer 13 may include a dielectric multilayer film.

In the foregoing embodiment, although both of the hole transport layer 141 and the electron transport layer 143 are used as the common layers, respectively, only one of them may be used as the common layer. Further, the auxiliary wiring layer 17 is not limited to the case where the auxiliary wiring layer 17 and the lower electrode (the first electrode layer 13) are collectively formed, but the auxiliary wiring layer 17 and the metal layer constituting the drive transistor Tr1 and the write transistor Tr2 may be collectively formed. Alternatively, the auxiliary wiring layer 17 may be formed in an independent step. Further, all of the organic light emitting elements 10R, 10G, and 10B may have the same dimensions, or may have dimensions different from each other.

In addition, in the foregoing embodiment, although the description has been specifically made with reference to the structure of the organic light emitting elements 10R, 10G, and 10B, it is not always necessary to include all the layers, and other layers may be additionally included. For example, between the first electrode layer 13 and the organic layer 14, a thin film layer for hole injection composed of chrome oxide (III) ($Cr_2O_3$), ITO (indium-tin oxide: oxide mixed film of indium (In) and tin (Sn)), or the like may be included.

In addition, in the foregoing embodiment, although the description has been made on the case of the active matrix display device, the present invention is applicable to a passive matrix display device. Further, the structure of the pixel drive circuit for the active matrix drive is not limited to that described in the foregoing embodiment and the like, and a capacitance element and a transistor may be added, if necessary. In that case, according to the change of the pixel drive circuit, a necessary drive circuit may be added in addition to the signal line drive circuit 120 and the scanning line drive circuit 130 described above.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display device comprising:
 a pixel including a plurality of light emitting elements each formed by sequentially stacking a first electrode layer, an organic layer, and a second electrode layer, spaced apart from each other in a first direction orthogonal to the stacking direction thereof, and emitting light emission colors different from each other,
 wherein a plurality of the pixels are aligned in the first direction so as to include a larger gap which is larger than a gap between the light emitting elements adjacent to each other, and
 a wiring layer is provided between the pixels adjacent to each other, and
 wherein an isolation layer is provided to fill the gap between the light emitting elements adjacent to each other and to fill the larger gap between first electrode layers of adjacent pixels, the isolation layer having a concave portion in the larger gap that exposes the wiring layer.

2. The display device according to claim 1, wherein
 the organic layer includes a stacked structure of a hole transport layer, a light emitting layer, and an electron transport layer, and
 at least one of the hole transport layer and the electron transport layer is formed as a common layer shared by the plurality of light emitting elements which constitute each of the pixels.

3. The display device according to claim 1, wherein, in the light emitting element, a dimension of a second direction orthogonal to the first direction is set to be larger than the dimension of the first direction.

4. The display device according to claim 1, wherein
 the plurality of light emitting elements are composed of a red light emitting element including a red light emitting layer which emits a red light, a green light emitting element including a green light emitting layer which emits a green light, and a blue light emitting element including a blue light emitting layer which emits a blue light, and
 the blue light emitting layer is formed as a common layer shared by the red light emitting element, the green light emitting element, and the blue light emitting element.

5. The display device according to claim 1, wherein
 the plurality of pixels are aligned in the second direction orthogonal to the first direction, and
 the wiring layer is arranged so as to surround each of the plurality of pixels.

6. A method of manufacturing a display device comprising steps of:
 forming a wiring layer including a plurality of wiring layer portions spaced apart from each other in a first direction on a substrate; and
 forming a pixel between the wiring layer portions adjacent to each other, respectively, the pixel having a stacked structure of a first electrode layer, an organic layer, and including a plurality of light emitting elements emitting light emission colors different from each other,
 wherein the plurality of light emitting elements are aligned so as to include a gap which is smaller than a larger gap between the pixels adjacent to each other in the first direction, and
 wherein an isolation layer is provided to fill the gap between the light emitting elements adjacent to each other and to fill the larger gap between first electrode layers of adjacent pixels, the isolation layer having a concave portion in the larger gap that exposes the wiring layer.

7. The method of manufacturing a display device according to claim 6, wherein
 the organic layer is formed so as to sequentially include a hole transport layer, a light emitting layer, and an electron transport layer, and
 at least one of the hole transport layer and the electron transport layer is formed as a common layer shared by the plurality of light emitting elements which constitute each of the pixels.

8. The method of manufacturing a display device according to claim 6, wherein at least one of the hole transport layer and the electron transport layer is formed by using a mask covering a region corresponding to the wiring layer, and including an aperture in a region corresponding to the pixel.

9. The method of manufacturing a display device according to claim 6, wherein
- a red light emitting element including a red light emitting layer which emits a red light, a green light emitting element including a green light emitting layer which emits a green light, and a blue light emitting element including a blue light emitting layer which emits a blue light are formed as the plurality of light emitting elements, and
- the blue light emitting layer is formed as a common layer shared by the red light emitting element, the green light emitting element, and the blue light emitting element.

10. The method of manufacturing a display device according to claim 6, wherein
- the plurality of pixels are aligned to be spaced apart from each other in the second direction orthogonal to the first direction, and
- the wiring layer is arranged so as to surround each of the plurality of pixels.

\* \* \* \* \*